United States Patent [19]
Herstek et al.

[11] Patent Number: 5,288,027
[45] Date of Patent: Feb. 22, 1994

[54] DISPENSING METHOD AND APPARATUS INCLUDING A RIBBON NOZZLE FOR COATING PRINTED CIRCUIT BOARDS

[75] Inventors: Glen Herstek, Lorain; William E. Donges, Wellington; James J. Turner, Amherst, all of Ohio; Ronald Bernt, Duluth, Ga.

[73] Assignee: Nordson Corporation, Westlake, Ohio

[21] Appl. No.: 915,113

[22] Filed: Jul. 17, 1992

[51] Int. Cl.⁵ .................................. B05B 1/04
[52] U.S. Cl. ........................ 239/594; 239/597
[58] Field of Search ............ 239/568, 594, 595, 597

[56] References Cited

U.S. PATENT DOCUMENTS

| | | | |
|---|---|---|---|
| 796,027 | 8/1905 | Wittbold | 239/597 X |
| 1,503,001 | 7/1924 | Murray | 239/597 X |
| 1,753,443 | 4/1930 | Murray | 239/597 |
| 1,889,201 | 11/1932 | Holveck | 239/597 |
| 2,755,137 | 7/1956 | Hughf | 239/597 X |
| 3,033,470 | 5/1962 | Choitz | 239/597 X |
| 4,334,637 | 6/1982 | Baker et al. | |
| 4,346,849 | 8/1982 | Rood | 239/597 |
| 4,349,947 | 9/1982 | Rood | |
| 4,880,663 | 11/1989 | Shimada | |
| 4,982,896 | 1/1991 | Crow | 239/594 X |

FOREIGN PATENT DOCUMENTS 23806091 10/1991 Japan .
294200 10/1953 Switzerland .

*Primary Examiner*—Andres Kashnikow
*Assistant Examiner*—William Grant
*Attorney, Agent, or Firm*—Wood, Herron & Evans

[57] ABSTRACT

A dispensing apparatus including an airless ribbon nozzle having a nozzle tip formed with a nozzle bore tapering radially inwardly from an inlet end to a semispherical-shaped discharge end which intersects a rectangular-shaped discharge slot. The nozzle is mounted in position on a coating dispenser such that the inlet of the nozzle tip communicates with a coating passageway within the dispenser to receive coating material which is emitted from the discharge slot of the nozzle tip in a wide, splash-free, leaf-shaped pattern.

9 Claims, 2 Drawing Sheets

U.S. Patent  Feb. 22, 1994  Sheet 1 of 2  5,288,027
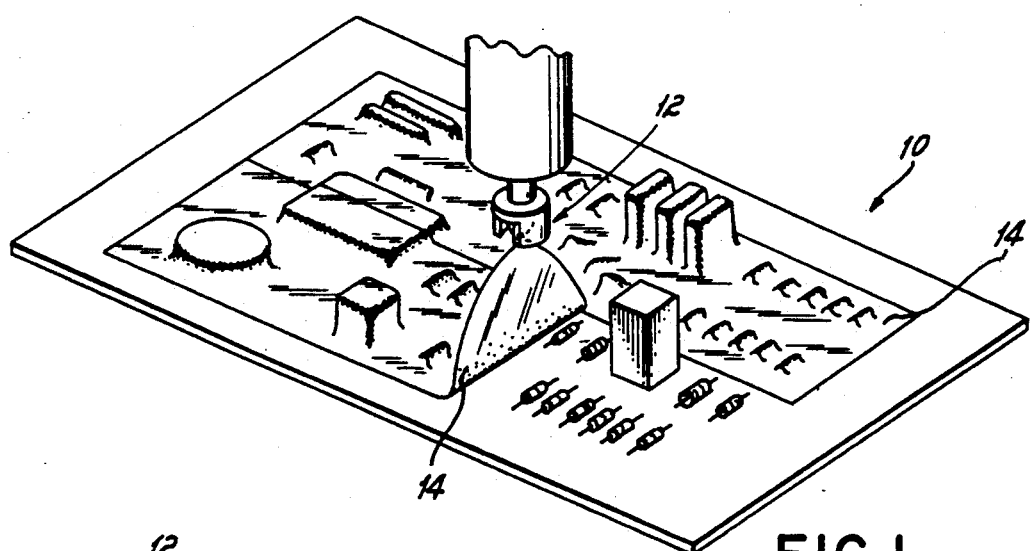
FIG. 1
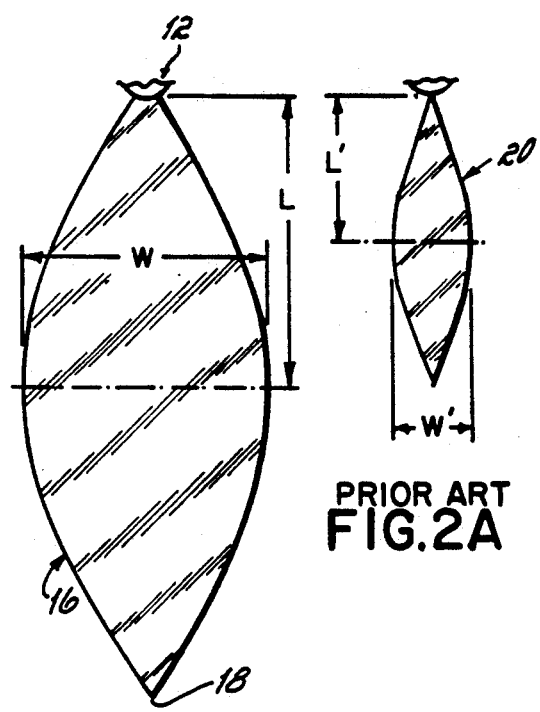
FIG. 2
PRIOR ART
FIG. 2A
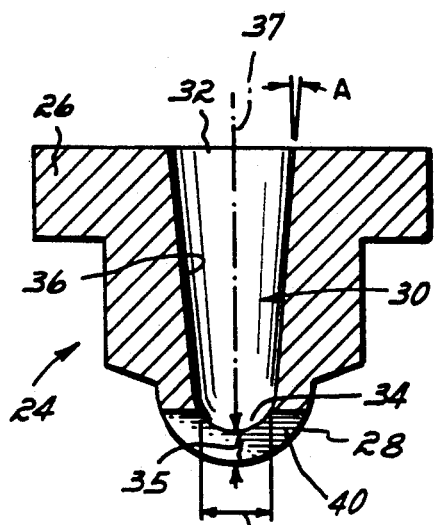
FIG. 4
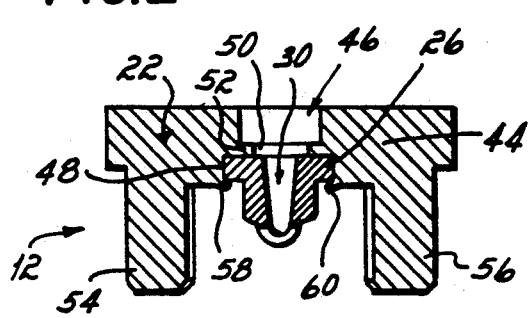
FIG. 3
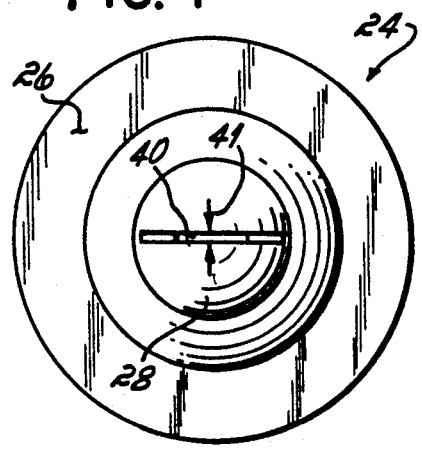
FIG. 5

DISPENSING METHOD AND APPARATUS INCLUDING A RIBBON NOZZLE FOR COATING PRINTED CIRCUIT BOARDS

FIELD OF THE INVENTION

This invention relates to apparatus for applying an insulative coating to printed circuit boards, and, more particularly, to a ribbon nozzle adapted for use with a coating dispenser which is effective to apply a wide, splash-free and uniform pattern of insulative liquid coating material onto printed circuit boards.

BACKGROUND OF THE INVENTION

Packaged circuit boards for electronic instruments are typically coated by a moisture-proof insulative film to protect the circuit boards from moisture, electric leakage and dust. The moisture-proof insulative films are what are known as conformal coatings, such as acrylic, polyurethane or epoxy synthetic resins dissolved in a volatile solvent. When applied to a clean printed circuit board, an insulative resin film is formed as the solvent evaporates on a continuous basis.

One preferred method and apparatus for applying liquid coating material to printed circuit boards is disclosed in U.S. Pat. Nos. 4,753,819 and 4,880,663, both to Shimada, which are owned by the assignee of this invention. In accordance with the method disclosed in these patents, printed circuit boards are coated with an insulative coating of high quality, in terms of thickness, uniformity and the absence of splashing, by applying the liquid coating material to an airless flat pattern nozzle at a supply pressure, e.g., five $Kg/cm^2$ for a 100 cps viscosity coating, such that a liquid film emission from the nozzle is produced in the form of a flat, leaf-shaped pattern. The leaf-shaped pattern, which is substantially free of atomized particles, has a maximum width at approximately its center and decreases in width is on both sides of the center to approximately zero width at the discharge outlet of the flat spray nozzle and at the end of the pattern. The nozzle and printed circuit board are spaced relative to each other to locate the circuit board in the path of the flat, leaf-shaped liquid film pattern where the width of the pattern is maximum. The method disclosed in the Shimada patents is therefore predicated upon the concept of operating airless spray nozzles at pressures substantially below the pressures at which they are normally operated, i.e., atomizing pressures. One airless, flat spray nozzle of the type which has been used for this purpose is disclosed in U.S. Pat. No. 4,349,947, owned by the assignee of this invention.

Despite obtaining a splash-free pattern of coating material on the printed circuit boards, the nozzles employed in the method and apparatus disclosed in the Shimada patents have certain limitations. One problem with such nozzles has been that the width of the leaf-shaped pattern, even at its maximum point, is relatively narrow. As a result, a relatively long period of time is required to complete coating of a printed circuit board because the nozzle must be moved in a series of side-by-side rows and/or columns a sufficient number of times to cover the entire surface area of the circuit board. Additionally, it has been found that such airless spray nozzles produce a flat spray or "ribbon" pattern which tends to be uneven across the width of the pattern. Moreover, if the pressure at which the coating material flows through the nozzle is increased or decreased, the thickness of the film or layer of coating material applied to the printed circuit board can also vary.

A still further limitation of airless spray nozzles of the type employed in the Shimada patents is that the leaf-shaped pattern emitted therefrom has a maximum width at a relatively short distance from the discharge outlet of the nozzle. As mentioned above, it is desirable to position the nozzle with respect to the printed circuit board such that the leaf-shaped pattern is at maximum width when it contacts the board in order to obtain maximum coverage of coating material. Because this point of maximum width of the leaf-shaped pattern is relatively close to the discharge outlet of prior art spray nozzles, sufficient clearance may not be provided between the nozzle and some of the elements on the printed circuit board without raising the nozzle vertically upwardly relative to the board by robot manipulators or other gun moving devices. Movement of the nozzle upwardly relative to the printed circuit board complicates the coating operation and can reduce the width of the pattern obtained on the board because the tapered leaf-shaped pattern decreases in width in both directions from its centerpoint. This can produce gaps or spaces in the layer of coating material applied to the printed circuit board where the patterns are is applied side-by-side in columns or rows as the nozzle and printed circuit board are moved relative to one another.

SUMMARY OF THE INVENTION

It is therefore among the objectives of this invention to provide a dispensing apparatus including an airless spray nozzle adapted for use with a coating dispenser to apply a layer of coating material onto printed circuit boards which produces a wide, splash-free flat or ribbon pattern on the board, which provides for more uniform thickness of the coating material layer and which can be located a comparatively large distance from the surface of the printed circuit board while obtaining maximum pattern width.

These objectives are accomplished in a dispensing apparatus including an airless spray nozzle having a nozzle tip formed with a nozzle bore which tapers radially inwardly from an inlet end to a discharge end. The discharge end of the nozzle bore has a semispherical configuration which intersects a rectangular-shaped discharge slot formed in the nozzle tip. The nozzle is mounted in position on a dispenser such that the inlet of the nozzle tip communicates with a coating passageway within the dispenser to receive coating material which is emitted from the discharge slot in a leaf-shaped pattern.

It has been found through experimentation that the above-described configuration of the airless spray nozzle of this invention provides a number of advantages over other airless spray nozzles in the application of insulative coating material onto printed circuit boards. The combination of an inwardly tapering nozzle bore with a semispherical-shaped discharge end, and a rectangular-shaped slot which intersects such discharge end, has been found to produce a leaf-shaped, flat or ribbon pattern which is two to three times wider at its maximum width than the leaf-shaped patterns which can be obtained with other airless spray nozzles. That is, the leaf-shaped ribbon pattern produced by the nozzle tip of this invention tapers radially outwardly from the discharge slot to a point of maximum width which is two to three times wider than that obtained by other airless spray nozzles. The entire printed circuit board can therefore be completely covered with a layer of coating material two to three times faster than had been possible with other airless spray nozzles which substantially increases production time.

Additionally, it has been found that the point of maximum width of the leaf-shaped pattern obtained with the nozzle herein occurs at a further distance from the discharge slot than in other airless spray nozzles. As a result, the nozzle of this invention can be positioned further from the printed circuit board during operation, without moving it upwardly and/or downwardly relative to the board, and still clear all of the elements on the printed circuit board while applying a maximum width pattern. This greatly simplifies the coating operation and avoids the production of spaces or gaps between adjacent ribbon patterns.

Another advantage of the nozzle of this invention is that a substantially uniform thickness layer of coating material is applied to the printed circuit board even with variations in the pressure at which the coating material is supplied to the nozzle. It is contemplated that in most applications the pressure at which the coating material would be supplied to the nozzle is in the range of about 20 to 50 psi. It has been found that variation of the pressure within at least this range does not affect the thickness of the coating layer, as in other airless spray nozzles, but such pressure change only affects the width of the pattern obtained with the nozzle herein. Such pattern width variation may be desirable in certain applications depending upon the configuration of the elements placed on the printed circuit board.

DESCRIPTION OF THE DRAWINGS

The structure, operation and advantages of the presently preferred embodiment of this invention will become further apparent upon consideration of the following description, taken in conjunction with the accompanying drawings, wherein:

FIG. 1 illustrates the application of flat or ribbon patterns of coating material, parallel to one another, onto a printed circuit board;

FIG. 2 illustrates a leaf-shaped pattern obtained with the nozzle of this invention;

FIG. 2A illustrates a leaf-shaped pattern obtained with a prior art airless spray nozzle;

FIG. 3 is a cross sectional view of the nozzle tip of this invention mounted to one type of nozzle holder;

FIG. 4 is an enlarged view of the nozzle tip herein;

FIG. 5 is a view looking at the tip of the nozzle of FIG. 4;

DETAILED DESCRIPTION OF THE INVENTION

Figures 6, 7:
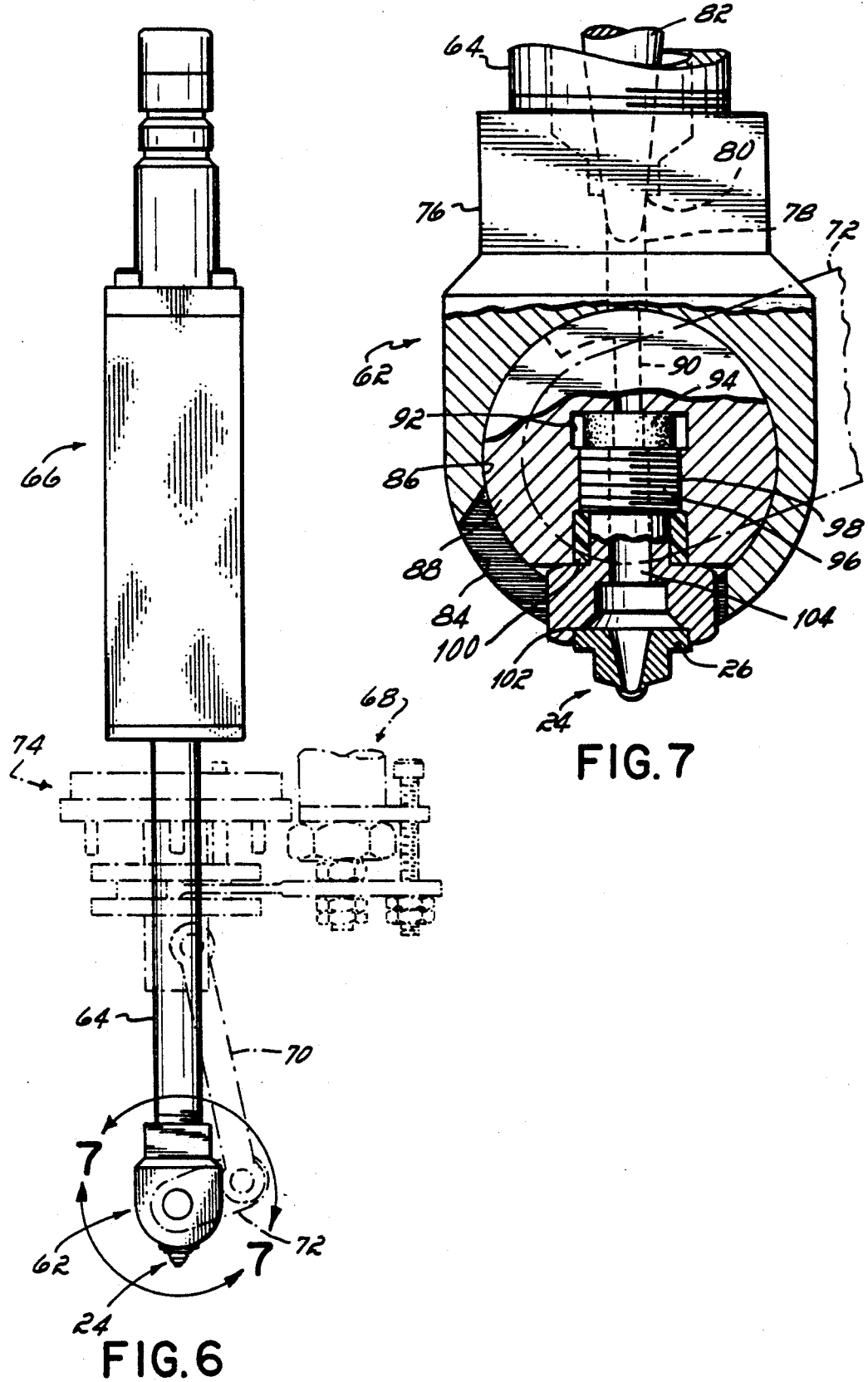
FIG. 6 is an elevational view of a coating dispenser and an alternative nozzle construction for mounting the nozzle tip of this invention.
FIG. 7 is an enlarged view, in partial cross section, of the circled area of FIG. 6.

With reference initially to FIG. 1, a substrate of a printed circuit board 10 having circuit components depicted schematically thereon is disposed in a generally horizontal plane below a ribbon nozzle 12 described below in connection with a discussion of FIGS. 3-5. Parallel bands or ribbons 14 of coating material are deposited side-by-side by the nozzle 12 by effecting relative motion between the nozzle 12 and printed circuit board 10. As best shown in FIG. 2, when pressurized liquid coating material is emitted from the nozzle 12, a substantially leaf-shaped pattern 16 is obtained which tapers radially outwardly from the nozzle 12 to a maximum width W at a distance L from the nozzle 12. Once it reaches its maximum width W, the leaf-shaped pattern 16 then tapers inwardly to a tip 18 of substantially zero width.

As discussed below in connection with the operation of nozzle 12, the leaf-shaped pattern 16 obtained with this invention has a maximum width W which is on the order of at least two to three times greater than the maximum width W' of leaf-shaped patterns 20 obtained with prior art nozzles. See FIG. 2A. Additionally, the length L' at which the prior art leaf-shaped pattern 20 reaches its maximum width W' is appreciably less than that obtained with the leaf-shaped pattern 16 of this invention. The exact length L from the nozzle 12 to the point of maximum width W of ribbon pattern 16 is a function of the viscosity of the liquid coating material and the pressure at which it is supplied to the nozzle 12. For most applications, discharge pressure is equivalent to approximately eight $Kg/cm^2$ or less for insulative, liquid coatings having viscosities in the approximate range of 125-155 cps. Under these conditions, a pattern 16 is obtained from nozzle 12 which is substantially splash-free and of uniform thickness on the printed circuit board 10.

Referring to FIGS. 3-5, the detailed construction of one embodiment of the nozzle 12 is illustrated. The nozzle 12 comprises a nozzle adaptor 22 and a nozzle tip 24. The nozzle tip 24 is preferably formed of a hard, abrasive-resistant material such as tungsten carbide whereas the nozzle adaptor 22 can be formed of a less expensive, more easily machineable material such as stainless steel. The nozzle tip 24 has a stepped outer surface including an annular flange 26 at one end and a semispherical-shaped outer surface 28 at the opposite end. The nozzle tip 24 is formed with a nozzle bore 30 having an inlet 32 at the annular flange 26, and a generally semispherical-shaped blind recess 34 at the opposite end which terminates short of the outer surface 28 of the nozzle tip 24 forming a solid web 35 therebetween. The nozzle bore 30 defines an inner wall 36 within nozzle tip 24 which preferably tapers inwardly at an angle A of about 10, relative to the longitudinal axis 37 of nozzle bore 30 from its inlet 32 to the blind recess 34. See FIG. 4. In the presently preferred embodiment, the diameter of the semispherical-shaped blind recess 34 is in the range of about 0.022 to 0.040 inches. Additionally, the thickness of the web 35 between the blind recess 34 and the semispherical outer surface 28 of nozzle tip 24 is preferably in the range of about 0.004 to 0.024 inches.

In the presently preferred embodiment, a tool such as a grinding wheel (not shown) is used to form a rectangular-shaped discharge slot 40 in the nozzle tip 24 which extends from its outer semispherical-shaped surface 28 inwardly to intersect the blind recess 34 of the nozzle bore 30. Preferably, the width of the discharge slot 40, as indicated by the reference number 41 in FIG. 5, is in the range of about 0.002 to 0.004 inches. The length of the discharge slot 40 which opens into the nozzle bore 30, depicted with the reference number 42 in FIG. 4, is preferably in the range of about 0.018 to 0.036 inches.

The nozzle adaptor 22 comprises a generally cylindrical body 44 formed with an axial bore 46. This axial bore 46 is stepped and includes a generally counterbored end section 48 and a small diameter section 50. A countersunk shoulder 52 is located between the two different diameter sections 48, 50 which is shaped to engage the annular flange 26 of nozzle tip 24. A pair of spaced ears 54, 56 are located on one face of the nozzle adaptor 22 which function to protect the nozzle tip 24 against inadvertent contact with foreign objects. Disposed radially inwardly from the spaced ears 54, 56 are a pair of spaced lips 58, 60. The nozzle tip 24 is retained within the axial bore 46 of the nozzle adaptor 22 by swaging the spaced lips 58, 60 over the annular flange 26 of nozzle tip 24 after it is seated against the shoulder 52. The nozzle tip 24 is sealed relative to the axial bore 46 at shoulder area 52 and counterbored end section 48 by a brazing compound which forms a liquid-tight barrier between the nozzle tip 24 and nozzle adaptor 22.

Referring now to FIGS. 6 and 7, an alternative is embodiment of a nozzle holder 62 for the nozzle tip 24 is illustrated which is disclosed in U.S. patent application Ser. No. 07/510,001, to Sharpless et al, entitled "Spray Gun With Five Axis Movement", owned by the assignee of this invention, now U.S. Pat. No. 5,141,165, which is hereby incorporated by reference in its entirety herein. The nozzle holder 62 is threaded to an extension 64 connected to a coating dispenser 66. As illustrated in phantom in FIG. 6, structure designated generally by the reference number 68 is provided to reciprocate a crank arm 70 and tilt lever 72 which produces pivotal motion of the nozzle holder 62 and nozzle tip 24. Structure is also provided for rotating the nozzle holder 62 and nozzle tip 24 which is depicted generally with the reference number 74 in FIG. 6. This structure forms no part of the subject matter of this invention and is therefore not discussed herein. Reference should be made to the aforementioned U.S. Pat. No. 5,141,165 for a detailed discussion of same.

The nozzle holder 62 is illustrated in more detail in FIG. 7. It comprises a swivel base 76 formed with a bore 78 having a seat 80 which receives the tapered end of a plunger 82 associated with the coating dispenser 66. The swivel base 76 of nozzle holder 62 is formed with a lower body portion 84 having a throughbore 86 which pivotally and slidably mounts a nozzle support member 88. The nozzle support member 88, in turn, is mounted to the tilt lever 72 to permit rotational movement thereof with respect to the lower body portion 84 of swivel base 76 in response to movement of tilt lever 72 as discussed in detail in U.S. Pat. No. 5,141,165. The nozzle support member 88 is formed with a connector passageway 90 which extends between the bore 78 and a larger diameter cavity 92. A spacer 94 is interposed between the connector passageway 90 and a nozzle sleeve 96 which mounts the nozzle tip 24 as described below. The nozzle sleeve 96 is received within a bore 98 extending from the bottom of nozzle support member 88 to the cavity 92. The upper portion of this bore 98 has internal threads adapted to mate with external threads on the nozzle sleeve 96 so that the nozzle sleeve 96 can be threaded into the nozzle support member 88 and tightened down against the spacer 94. Preferably, the unthreaded, lower portion of nozzle sleeve 96 mounts a Teflon ring 100 which seals the bore 98 beneath its internal threads to prevent the leakage of coating material therepast.

The nozzle tip 24 is preferably brazed to the base of nozzle sleeve 96 in a manner such as described, for example, in U.S. Pat. No. 4,346,849 to Rood. That is, the annular flange 26 of nozzle tip 24 is received within a seat 102 formed in the nozzle sleeve 96 and brazed thereto such that the inlet 32 of nozzle bore 30 of nozzle tip 24 communicates with a throughbore 104 in nozzle sleeve 96. As viewed in FIG. 7, a flow path is therefore created from the coating dispenser 66 and extension 64 into the bore 78 of nozzle holder 62, through connector passageway 90 and throughbore 104 of nozzle support member 88, and, into the nozzle bore 30 of nozzle tip 24.

Nozzle Operation

As depicted in FIG. 1 and mentioned above, the nozzle tip 24 is effective to apply a flat pattern or ribbon 14 of insulative coating material onto the printed circuit board 10. Preferably, the nozzle 12 or nozzle holder 62 is positioned vertically above the circuit board 10 a distance L so that the leaf-shaped pattern 16 contacts the board 10 at a point where the pattern 16 is of maximum width W. The nozzle 12 or nozzle holder 62, and circuit board 10, are moved relative to one another so that successive ribbons 14 are applied side-by-side to substantially cover all of the elements on the circuit board 10 with a splash-free, uniform thickness layer of insulative coating material to protect the circuit elements against dust, moisture and the like.

As mentioned above, and schematically depicted in FIGS. 2 and 2A, the nozzle tip 24 herein is effective to produce a leaf-shaped pattern 16 having a maximum width W which is two to three times greater than the maximum width W' of leaf-shaped patterns 20 obtained with prior art airless spray nozzles. Additionally, the nozzle tip 24 can be positioned at a greater distance L from the circuit board 10, compared to prior art nozzles (note distance L' in FIG. 2A), and still apply a ribbon 14 of maximum width W onto the circuit board 10. This provides additional clearance between the nozzle 12 or nozzle holder 62 and the circuit elements on the printed circuit board 10 so that they need not be moved vertically upwardly and downwardly with respect to the circuit board 10 during a coating operation. As a result, the printed circuit board 10 can be coated more rapidly and with essentially no vertical movement of the nozzle 12 or nozzle holder 62 in comparison to prior art nozzles.

EXAMPLE

The nozzle tip 24 is operative to obtain the desired splash-free, relatively wide ribbon pattern upon a substrate under the following conditions.

| | |
|---|---|
| Insulative Coating Material: | Humiseal 1B31 Manufactured by the Humiseal Division of Columbia Chase Corporation, Woodside, New York |
| Material Temperature: | 110° F. |
| Pressure: | 50 psi |
| Distance L of Nozzle Tip From Substrate: | 0.50 inches |
| Flow Rate of Material: | 142 ml/min. |
| Pattern Width: | 1.125 inches |
| Film Build: | .0015 inches |
| Discharge Slot Width: (Width 41) | .004 inches |
| Discharge Slot Length: (Length 42) | .025 inches |
| Web Thickness: (Thickness 35) | .008 inches |
| Blind Recess Diameter: | .0315 inches |

Using a nozzle tip 24 of the above construction, and employing the above-identified operating conditions, a leaf-shaped pattern 16 is obtained having the desired width and application characteristics.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. For example, the nozzle adaptor 22 shown in FIG. 3 and the nozzle holder 62 illustrated in FIGS. 6 and 7 are only examples of structure which may be employed to mount the nozzle tip 24 and is not intended to in any way limit the scope of the invention. Additionally, it is contemplated that other types of coating materials could be dispensed from the nozzle tip 24 besides solvent borne coatings including one hundred percent solids coatings.

Therefore, it is intended that the invention not be limited to the particular embodiment disclosed as the best mode contemplated for carrying out this invention, but that the invention will include all embodiments falling within the scope of the appended claims.

We claim:

1. A nozzle adapted for use with a coating dispenser for depositing a flat ribbon pattern of coating material onto a printed circuit board, comprising:

a nozzle tip formed with a nozzle bore having an inlet end, a discharge end and a longitudinal axis, said nozzle bore tapering inwardly relative to said longitudinal axis from said inlet end toward said discharge end, said discharge end forming a generally semispherical-shaped blind recess within said nozzle tip;

the nozzle tip further being formed with a substantially semispherical-shaped outer end, said semispherical-shaped blind recess of the discharge end of said nozzle bore being spaced from said semispherical-shaped outer end a distance in the range of approximately 0.004 to 0.024 inches and;

said nozzle tip being formed with a discharge slot which intersects said semispherical-shaped blind recess at the discharge end of said nozzle bore, said discharge slot being substantially rectangular in shape including a length dimension and a width dimension which is substantially constant along the entire length dimension of the slot, said length dimension being in the range of about 0.018 to 0.036 inches, and said width dimension being in the range of about 0.002 to 0.004 inches.

2. The nozzle of claim 1 in which said nozzle bore forms an internal wall within said nozzle body, said internal wall being tapered relative to said longitudinal axis of said nozzle bore at an angle of about 10°.

3. Apparatus for depositing a flat ribbon pattern of coating material onto a printed circuit board comprising:

a coating dispenser;

a nozzle mounted to said coating dispenser, said nozzle including a nozzle tip formed with a nozzle bore having an inlet end, a discharge end and a longitudinal axis, said nozzle bore tapering inwardly relative to said longitudinal axis from said inlet end toward said discharge end, said discharge end forming a generally semispherical-shaped blind recess within said nozzle tip;

the nozzle tip further being formed with a substantially semispherical-shaped outer end, said semispherical-shaped blind recess of the discharge end of said nozzle bore being spaced from said semispherical-shaped outer end a distance in the range of approximately 0.004 to 0.024 inches;

said nozzle tip being formed with a discharge slot which intersects said semispherical-shaped blind recess at the discharge end of said nozzle bore, said discharge slot being substantially rectangular in shape including a length dimension and a width dimension which is substantially constant along the entire length dimension of the slot, said length dimension being in the range of about 0.018 to 0.036 inches, and said width dimension being in the range of about 0.002 to 0.004 inches.

4. The apparatus of claim 3 in which said nozzle bore of said nozzle tip forms an internal wall within said nozzle tip, said internal wall being tapered relative to said longitudinal axis of said nozzle bore at an angle of about 10°.

5. The apparatus of claim 3 wherein the nozzle emits a substantially leaf-shaped pattern of coating material from said discharge slot, the leaf-shaped pattern having a maximum width W at a distance L from said discharge slot, the apparatus further comprising mounting means for movably mounting a flat printed circuit board opposite the nozzle and discharge slot, the mounting means positioning the circuit board approximately a distance L from the discharge slot and generally perpendicular the longitudinal axis of the nozzle bore.

6. The apparatus of claim 5 further comprising means to move the board relative to the nozzle at a constant distance L to obtain a substantially splash-free, uniform thickness layer of the coating material on the surface of the entire printed circuit board.

7. A method of applying a layer of coating material onto a printed circuit board comprising:

supplying insulative coating material into the nozzle bore of a nozzle, the nozzle bore tapering radially inwardly from an inlet to a semispherical-shaped blind recess, the nozzle having a tip formed with a substantially semispherical-shaped outer end, said semispherical-shaped blind recess being spaced from said semispherical-shaped outer end a distance in the range of approximately 0.004 to 0.024 inches;

emitting a substantially leaf-shaped pattern of coating material from a rectangular-shaped discharge slot which intersects said blind recess, said discharge slot having a length dimension in the range of about 0.018 to 0.036 inches, and said discharge slot having a width dimension in the range of about 0.002 to 0.004 inches, said leaf-shaped pattern having a maximum width W at a distance L from said discharge slot;

positioning the printed circuit board and said nozzle at a distance L from one another and effecting relative movement therebetween at aid distance L to obtain a substantially splash-free, uniform thickness layer of the coating material on the surface of the printed circuit board.

8. The method of claim 7 further comprising the step of positioning the printed circuit board and nozzle at a distance L from one another during the entire application.

9. The method of claim 7 wherein the nozzle bore has a longitudinal axis, the nozzle bore forming an internal wall within the nozzle, which is tapered relative to the longitudinal axis at an angle of approximately 10°.

* * * * *

UNITED STATES PATENT AND TRADEMARK OFFICE
CERTIFICATE OF CORRECTION

PATENT NO. :   5,288,027
DATED      :   February 22, 1994
INVENTOR(S):   Herstek et al It is certified that error appears in the above-indentified patent and that said Letters Patent is hereby corrected as shown below:

Column 2, line 25, delete "is" after "are".

Column 4, line 44, "10" should be -- 10° --.

Column 5, line 16, delete "is" after "alternative".

Column 8, line 56, "aid" should be -- said --.

Signed and Sealed this

Fifteenth Day of November, 1994

Attest:

BRUCE LEHMAN

*Attesting Officer*   *Commissioner of Patents and Trademarks*